(12) United States Patent
Nishioka et al.

(10) Patent No.: US 8,284,526 B2
(45) Date of Patent: Oct. 9, 2012

(54) TUNNELING JUNCTION MAGNETORESISTIVE EFFECT ELEMENT AND MANUFACTURING METHOD THEREOF

(75) Inventors: Koichi Nishioka, Hiratsuka (JP); Koji Sakamoto, Odawara (JP); Tatsumi Hirano, Ibaraki (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 130 days.

(21) Appl. No.: 12/955,746

(22) Filed: Nov. 29, 2010

(65) Prior Publication Data

US 2011/0141606 A1 Jun. 16, 2011

(30) Foreign Application Priority Data

Dec. 10, 2009 (JP) ................................ 2009-280551

(51) Int. Cl.
*G11B 5/33* (2006.01)
(52) U.S. Cl. .................................................... 360/324.2
(58) Field of Classification Search ............. 360/324.11, 360/324.12, 324.2; 29/603.01
See application file for complete search history.

(56) References Cited

U.S. PATENT DOCUMENTS

| | | | |
|---|---|---|---|
| 6,657,829 B2 | 12/2003 | Nakazawa et al. | |
| 7,252,852 B1 * | 8/2007 | Parkin | 427/131 |
| 7,408,749 B2 * | 8/2008 | Gill | 360/324.2 |
| 7,570,463 B2 * | 8/2009 | Parkin | 360/324.2 |
| 7,595,967 B1 * | 9/2009 | Moon et al. | 360/324.2 |
| 7,598,555 B1 * | 10/2009 | Papworth Parkin | 257/295 |
| 7,881,024 B2 * | 2/2011 | Ide et al. | 360/324.2 |
| 2006/0012926 A1 * | 1/2006 | Parkin | 360/324.2 |
| 2008/0055793 A1 | 3/2008 | Djayaprawira et al. | |

FOREIGN PATENT DOCUMENTS

| | | |
|---|---|---|
| JP | 2001-217483 A | 8/2001 |
| JP | 2006-080116 A | 3/2006 |

OTHER PUBLICATIONS

Tsunekawa et al., "Giant tunneling magnetoresistance effect in low-resistance CoFeB/MgO (001)/CoFeB magnetic tunnel junctions for read-head applications," 2005 American Institute of Physics, Applied Physics Letters, vol. 87., p. 1-3.

Butler et al., "Spin-dependent tunneling conductance of Fe/MgO/Fe sandwiches," 2001 The American Physical Society, Physical Review B, vol. 63, p. 1-12.

* cited by examiner

*Primary Examiner* — Angel A. Castro
(74) *Attorney, Agent, or Firm* — Zilka-Kotab, PC

(57) ABSTRACT

According to one embodiment, a TMR effect element includes a ground layer, an antiferromagnetic layer above the ground layer, a first ferromagnetic layer above the antiferromagnetic layer and exchange-coupled to the antiferromagnetic layer, an anti-parallel coupling layer above the first ferromagnetic layer, a second ferromagnetic layer having a magnetic moment coupled anti-parallel to the magnetic moment of the first ferromagnetic layer via the anti-parallel coupling layer, an insulation barrier layer above the second ferromagnetic layer, and a third ferromagnetic layer above the insulation barrier layer. At least a portion of the second ferromagnetic layer and at least a portion of the third ferromagnetic layer on an insulation barrier layer side are comprised of a crystal, and the insulation barrier layer comprises MgO and an oxide material having an independent cubic crystal structure and complete solid solubility with MgO. Other elements, heads, and formation methods are described according to various embodiments.

15 Claims, 8 Drawing Sheets

| AD (Gb/in2) | 350 | 500 | 750 | 1000 | 2000 |
|---|---|---|---|---|---|
| Head resistance ($\Omega$) | 400 | 400 | 400 | 400 | 400 |
| Tw (nm) | 65 | 58 | 45 | 35 | 20 |
| SH (nm) | 65 | 58 | 45 | 40 | 30 |
| S (um2) | 0.004225 | 0.003364 | 0.002025 | 0.0014 | 0.0006 |
| RA ($\Omega$ um2) | 1.7 | 1.3 | 0.9 | 0.6 | 0.2 |

$\phi_1 = A_1 \exp(i k_1 x) + A_2 \exp(-i k_1 x)$
$\phi_2 = B_1 \exp(k_2 x) + B_2 \exp(-k_2 x)$
$\phi_3 = C_1 \exp(i k_1 x)$
$T = C_1 / A_1$

| # | Material | Band gap | Space group | Crystal structure | Mismatch (%) | a (Å) | Solid solubility |

|   |     | (eV)      |       |      |      |       | limit with MgO |
|---|-----|-----------|-------|------|------|-------|----------------|
|   | MgO | 7.2       | Fm3m  | NaCl | 0    | 4.2112 | --             |
| 1 | NiO | 4.0       | Fm3m  | NaCl | -0.8 | 4.1770 | Complete solid solubility |
| 2 | CoO | 3.0       | Fm3m  | NaCl | 1.2  | 4.2610 | Complete solid solubility |
| 3 | FeO | 2.4-3.5   | Fm3m  | NaCl | 2.3  | 4.3070 | Complete solid solubility |
| 4 | VO  | <1        | Fm3m  | NaCl | -2.2 | 4.1200 | No solid solubility |
| 5 | TiO | 1.9       | Fm3m  | NaCl | 0.6  | 4.2350 | No solid solubility |
| 6 | MnO | 1.8-5     | Fm3m  | NaCl | 5.3  | 4.4360 | No data        |
| 7 | CaO | 10.0      | Fm3m  | NaCl | 14.2 | 4.8110 | No solid solubility |
| 8 | SrO | 3.8-4.3   | Fm3m  | NaCl | 22.5 | 5.1600 | No data        |
| 9 | BaO | 2.4       | Fm3m  | NaCl | 31.5 | 5.5390 | No data        |
| 10| TaO | 4.7       | Fm3m  | NaCl | 5.0  | 4.220  | No solid solubility |
| 11| ZrO | 3.7       | Fm3m  | NaCl | 9.7  | 4.6200 | No solid solubility |
| 12| ZnO | 3.4-3.8   | P63/mc| NaCl | --   | 3.2500 | 40% ZnO        |
| 13| NbO |           | Fm3m  | NaCl | --   | 4.2110 | No data        |
| 14| CuO | 2.2       | C12/c1| NaCl | --   | 4.6880 | No data        |

FIG. 10

TUNNELING JUNCTION MAGNETORESISTIVE EFFECT ELEMENT AND MANUFACTURING METHOD THEREOF

RELATED APPLICATIONS

The present application claims priority to a Japanese Patent Application filed Dec. 10, 2009, under Appl. No. 2009-280551, which is incorporated herein by reference.

FIELD OF THE INVENTION

The present invention relates to a tunneling junction magnetoresistive effect element for use in a magnetic recording and playback device, such as a magnetic disk device, and a method for manufacturing the element.

BACKGROUND

The development of higher recording densities in magnetic recording and playback devices is achieved by miniaturizing the recording track width and the recording bit length on the recording medium, but a result of this miniaturization is a decrease in the playback signal magnetic flux produced by recording bits on the recording medium. Therefore, in order to achieve a higher recording density, higher sensitivity for the sensor used in the playback head becomes necessary, and a highly sensitive tunneling magnetoresistive (TMR) film may be used.

Basically, a TMR film element is a structure formed by depositing a ground layer, an antiferromagnetic layer, a first ferromagnetic layer exchange-coupled to the antiferromagnetic layer, a second ferromagnetic layer which has a magnetic moment coupled anti-parallel to the magnetic moment of the first ferromagnetic layer through an anti-parallel coupling layer, an, insulation barrier layer, and a third ferromagnetic layer. The ferromagnetic layers of the first ferromagnetic layer, the anti-parallel coupling layer, and the second ferromagnetic layer are referred to as the pinned layer. The magnetic moments of the first ferromagnetic layer and the second ferromagnetic layer in the pinned layer have strong mutual anti-parallel coupling. Because the magnetic moment of the first ferromagnetic layer is strongly pinned by exchange coupling with the antiferromagnetic layer, the orientation of the magnetic moment of the pinned layer is not easily changed. On the other hand, the third ferromagnetic layer is referred to as the free layer. The direction of the magnetic moment of this layer is easily changed by a magnetic field applied externally.

The process of playing back the magnetic information recorded on the medium is as follows. When the signal magnetic field generated by a recording bit enters a sensor, the signal magnetic field causes the magnetic moment of the free layer to rotate. Therefore, the relative angle between the magnetic moments of the free layer and the pinned layer changes. When the relative angle changes, the resistance of the sensor changes in order to change the scattering probability due to the electron spin. The information of the recording bit is played back by transforming the change in resistance of the sensor into an electrical signal. For reference, FIG. 4 shows the playback process.

FIG. 5 presents a prediction example of the playback track width, the stripe height, and the area resistance RA which are required in order to respond to future increases in the surface recording density. In FIG. 5, the area resistance RA (hereinafter, referred to as RA) is the electrical resistance in the direction perpendicular to the film surface of a sensor having a 1 $\mu m^2$ area. The resistance of a TMR sensor is inversely proportional to the area of the sensor because the current passes perpendicular to the film surface.

In order to miniaturize the playback track width and the stripe height accompanying the increase in the recording density, the area of the sensor passing the detection current becomes smaller. Consequently, when the RA is constant temporarily, the resistance increases inversely proportional to the area of the sensor. For example, in FIG. 5, when the recording density is increased from 350 Gb/in$^2$ to 1000 Gb/in$^2$, unfortunately, the area of the sensor becomes one-fourth, and the resistance is increased by four fold. When the resistance is increased by four fold in this way, the signal processing circuit system will no longer operate normally. Consequently, the resistance of the sensor seen from the signal processing circuit system must be constant. In other words, the area resistance RA of the sensor must be decreased as the sensor is miniaturized. In FIG. 5, the RA is calculated so that the resistance of the sensor becomes constant even as the area of the sensor decreases. As shown in FIG. 5, RA is 1.0 $\Omega\mu m^2$ at a surface recording density of 500 Gb/in$^2$, which must decrease to an RA of 0.6 $\Omega\mu m^2$ at a surface recording density of 1000 Gb/in$^2$, and must decrease further to an RA of 0.2 $\Omega\mu m^2$ at a surface recording density of 2000 Gb/in$^2$. However, FIG. 5 shows only estimates. Although slight differences in the numerical values from the actual values are thought to arise, the future trends are represented.

In the description of Japanese Unexamined Patent Appl. Pub. No. 2006-80116, when MgO is created on a noncrystalline material Co—Fe—B alloy film by a sputtering method, MgO having good crystallinity may be produced, and a high MR ratio of 180% at room temperature is obtained by thermal processing. However, a problem with this technology is that the area resistance RA increases to 1000 $\Omega\mu m^2$, and the playback head resistance becomes too large for application to a playback head for a hard disk device.

With the objective of applying a TMR sensor using MgO to a playback head for a hard disk device, research has been conducted to improve the MR ratio in a low RA region. As a method for creating the insulation barrier layer, the proposal in K. Tsunekawa, D. D. Djayaprawira, M. Nagai, "CoFeB/MgO(001)/CoFeB Magnetic Tunnel Junctions for Read Head Applications," *Appl. Phys. Lett.*, 87, 072503 (2005) is a method which uses a magnesium oxide target to create a magnesium oxide layer via an RF sputtering method after a thin metallic magnesium layer of approximately 0.4 nm is deposited. By using this method, an MR ratio of 100% is realized at an RA of 2.0 $\Omega\mu m^2$.

As is clear from FIG. 5, however, the value needs to be decreased by a factor of 10 such that RA=0.2 $\Omega\mu m^2$ in order to produce the high recording density of 2000 Gb/in$^2$. Even if the method disclosed in K. Tsunekawa, D. D. Djayaprawira, M. Nagai, "CoFeB/MgO(001)/CoFeB Magnetic Tunnel Junctions for Read Head Applications," *Appl. Phys. Lett.*, 87, 072503 (2005) is used, when the RA becomes less than 2.0 $\Omega\mu m^2$, the MR ratio decreases abruptly, and the MR ratio at RA=0.2$\Omega\mu^2$ disappears. Therefore, when a known conventional TMR sensor using MgO is used in a 2000 Gb/in$^2$ playback head, problems arise where the playback sensitivity is not obtained, and the head does not function as a playback head. The magnitude of RA becomes smaller as the film thickness of the insulation barrier layer MgO becomes thinner.

In FIG. 16 of W. H. Butler, X.-G. Zhang and T. C. Schulthess, "Spin Dependent Tunneling Conductance of Fe|MgO|Fe Sandwiches," *Phys. Rev. 8*, 63, 054416-1 (2001), the film thickness of MgO and the theoretical calculation of the conductance are cited. The relationship to the MR ratio is the difference between the majority and anti-parallel conductances. When the number of MgO layers decreases, the difference between the majority and the anti-parallel conductances, which are related to the MR ratio, tends to decrease. When the majority and anti-parallel conductance lines are extended as straight lines, it is assumed that the MR ratio in three monolayers disappears for the most part because the lines intersect in the vicinity of the three monolayers. In investigations, the film thickness of the three monolayers of MgO corresponds to RA=0.3 $\Omega\mu m^2$. Consequently, the disappearance of the MR ratio at RA=0.3 $\Omega\mu m^2$ is believed to be the physical limit of the conventional TMR sensor when MgO is used in the insulation barrier layer.

In Japanese Unexamined Patent Appl. Pub. No. 2001-217483, the effects for a layered tunneling magnetoresistive effect element are the ability to form an insulation barrier layer having a completely oxidized metal layer without the oxidation affecting the ferromagnetic layers, and to form a thicker film for the insulation barrier layer. Also, the preferred effect is to use an oxide of at least one element selected from Al, Mg, Nb, Ni, Gd, Ge, Si, or Hf as the material of the insulation barrier layer.

In addition, the layered tunneling junction magnetoresistive effect element described in Japanese Unexamined Patent Appl. Pub. No. 2001-217483 uses a perovskite oxide, such as Ni, in the insulation barrier layer to correspond to using a perovskite oxide to form the ferromagnetic layers. The reasons are to relax the processing precision and to simplify the manufacturing process. This description does not suggest using an oxide other than a perovskite oxide, such as Ni, as the insulation barrier layer, and cannot expect the area resistance RA to decrease below 1.0 $\Omega\mu m^2$ even when this type of perovskite oxide is used as the insulation barrier layer.

Accordingly, a TMR head having a high MR rate of change even as the area resistance RA of the sensor decreases would be very beneficial in achieving higher density recording/playback magnetic heads for use in magnetic storage devices.

SUMMARY

According to one embodiment, a tunneling junction magnetoresistive effect element includes a ground layer, an anti ferromagnetic layer above the ground layer, a first ferromagnetic layer above the antiferromagnetic layer and exchange-coupled to the antiferromagnetic layer, an anti-parallel coupling layer above the first ferromagnetic layer, a second ferromagnetic layer having a magnetic moment coupled anti-parallel to the magnetic moment of the first ferromagnetic layer via the anti-parallel coupling layer, an insulation barrier layer above the second ferromagnetic layer, and a third ferromagnetic layer above the insulation barrier layer. At least a portion of the second ferromagnetic layer and at least a portion of the third ferromagnetic layer on an insulation barrier layer side are comprised of a crystal, and the insulation barrier layer comprises MgO and an oxide material having an independent cubic crystal structure and complete solid solubility with MgO.

In another embodiment, a tunneling junction magnetoresistive effect head includes at least one tunneling junction magnetoresistive effect element, each tunneling junction magnetoresistive effect element includes a ground layer, an antiferromagnetic layer above the ground layer, a first ferromagnetic layer above the antiferromagnetic layer and exchange-coupled to the antiferromagnetic layer, an anti-parallel coupling layer above the first ferromagnetic layer, a second ferromagnetic layer having a magnetic moment coupled anti-parallel to the magnetic moment of the first ferromagnetic layer via the anti-parallel coupling layer, an insulation barrier layer above the second ferromagnetic layer, and a third ferromagnetic layer above the insulation barrier layer. At least a portion of the second ferromagnetic layer and at least a portion of the third ferromagnetic layer on an insulation barrier layer side are comprised of a crystal, and the insulation barrier layer comprises MgO and an oxide material having an independent cubic crystal structure and complete solid solubility with MgO.

In yet another embodiment, a method for manufacturing a tunneling junction magnetoresistive effect element includes forming a ground layer above a substrate, forming an antiferromagnetic layer above the ground layer, forming a first ferromagnetic layer above the antiferromagnetic layer, forming an anti-parallel coupling layer above the first ferromagnetic layer, forming a second ferromagnetic layer above the anti-parallel coupling layer, forming an insulation barrier layer above the second ferromagnetic layer after the second ferromagnetic layer, wherein the insulation barrier layer comprises an oxide alloy comprising a first oxide material and a second oxide material, wherein the oxide alloy is formed via discharging two cathodes mounted with an MgO target as the first oxide material and a target of the second oxide material which has an independent cubic crystal structure and complete solid solubility with MgO in a vacuum, and forming a third ferromagnetic layer above the insulation barrier layer.

Any of these embodiments may be implemented in a magnetic data storage system such as a disk drive system, which may include a magnetic head, a drive mechanism for passing a magnetic storage medium (e.g., hard disk) over the head, and a control unit electrically coupled to the head for controlling operation of the head.

Other aspects and advantages of the present invention will become apparent from the following detailed description, which, when taken in conjunction with the drawings, illustrate by way of example the principles of the invention.

BRIEF DESCRIPTION OF THE DRAWINGS

FIG. 10 shows the band gap value, the crystal structure, the mismatch of the lattice with the MgO crystal, and the solid solubility limit for the MgO of various oxides, according to one embodiment.

DETAILED DESCRIPTION

Figure 1:
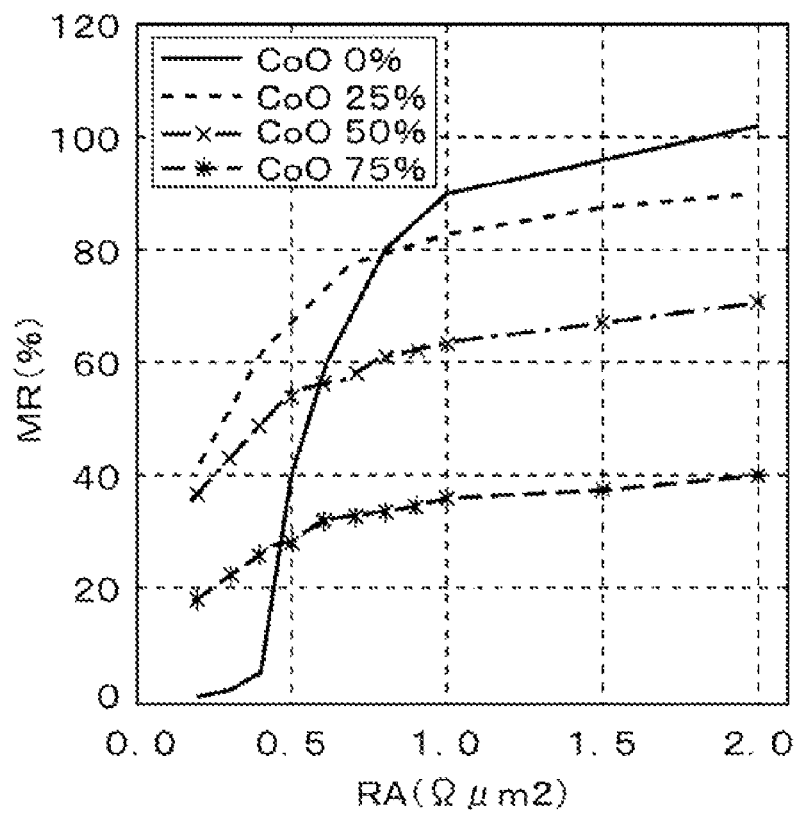
FIG. 1 shows the MR performance of a TMR sensor film according to a working example in one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

According to one general embodiment, a tunneling junction magnetoresistive effect element includes a ground layer, an antiferromagnetic layer above the ground layer, a first ferromagnetic layer above the antiferromagnetic layer and exchange-coupled to the antiferromagnetic layer, an anti-parallel coupling layer above the first ferromagnetic layer, a second ferromagnetic layer having a magnetic moment coupled anti-parallel to the magnetic moment of the first ferromagnetic layer via the anti-parallel coupling layer, an insulation barrier layer above the second ferromagnetic layer, and a third ferromagnetic layer above the insulation barrier layer. At least a portion of the second ferromagnetic layer and at least a portion of the third ferromagnetic layer on an insulation barrier layer side thereof are comprised of a crystal, e.g., have at least a portion that has a crystalline structure. The insulation barrier layer side thereof refers to the third ferromagnetic layer or both the second and third ferromagnetic layers. The portion(s) comprised of a crystal may be layers, analytically discernable sections, the entire layer, etc. The insulation barrier layer comprises MgO and an oxide material having an independent cubic crystal structure and complete solid solubility with MgO.

In another general embodiment, a tunneling junction magnetoresistive effect head includes at least one tunneling junction magnetoresistive effect element, each tunneling junction magnetoresistive effect element includes a ground layer, an antiferromagnetic layer above the ground layer, a first ferromagnetic layer above the antiferromagnetic layer and exchange-coupled to the antiferromagnetic layer, an anti-parallel coupling layer above the first ferromagnetic layer, a second ferromagnetic layer having a magnetic moment coupled anti-parallel to the magnetic moment of the first ferromagnetic layer via the anti-parallel coupling layer, an insulation barrier layer above the second ferromagnetic layer, and a third ferromagnetic layer above the insulation barrier layer. At least a portion of the second ferromagnetic layer and at least a portion of the third ferromagnetic layer on an insulation barrier layer side are comprised of crystal, and the insulation barrier layer comprises MgO and an oxide material having an independent cubic crystal structure and complete solid solubility with MgO.

In yet another general embodiment, a method for manufacturing a tunneling junction magnetoresistive effect element includes forming a ground layer above a substrate, forming an antiferromagnetic layer above the ground layer, forming a first ferromagnetic layer above the antiferromagnetic layer, forming an anti-parallel coupling layer above the first ferromagnetic layer, forming a second ferromagnetic layer above the anti-parallel coupling layer, forming an insulation barrier layer above the second ferromagnetic layer after the second ferromagnetic layer, wherein the insulation barrier layer comprises an oxide alloy comprising a first oxide material and a second oxide material, wherein the oxide alloy is formed via discharging two cathodes mounted with an MgO target as the first oxide material and a target of the second oxide material which has an independent cubic crystal structure and complete solid solubility with MgO in a vacuum, and forming a third ferromagnetic layer above the insulation barrier layer.

It is preferable for the area resistance RA to decrease below 1.0 $\Omega\mu m^2$ in order to achieve a higher recording density. However, in these low RA regions generally, the sensor sensitivity decreases in order to produce an abrupt drop in the MR ratio.

According to various embodiments disclosed herein, a TMR head having a high MR rate of change even as the area resistance RA of the sensor decreases is possible. More specifically, a tunneling junction magnetoresistive effect head having little deterioration in the MR ratio in a region having an area resistance RA less than 1.0 $\Omega\mu m^2$ and a method for manufacturing the same are presented according to various embodiments.

Preferably, the tunneling junction magnetoresistive effect element may be formed by depositing a ground layer, an antiferromagnetic layer above the ground layer, a first ferromagnetic layer above the antiferromagnetic layer and exchange coupled to the antiferromagnetic layer, an anti-parallel coupling layer, a second ferromagnetic layer which has a magnetic moment coupled anti-parallel tot he magnetic moment of the first ferromagnetic layer through the anti-parallel coupling layer, an insulation barrier layer, and a third ferromagnetic layer. A portion or all of the second ferromagnetic layer and the third ferromagnetic layer on the insulation barrier layer side is a crystal. The insulation barrier layer is constructed from MgO and a specific oxide material which has an independent cubic crystal structure and complete solid solubility with MgO.

In a preferred example, the insulation barrier layer may be constructed from an oxide mixture of MgO and the specific oxide material. Preferably, the insulation barrier layer may be constructed by layering MgO and the specific oxide material, according to one approach. Preferably, the insulation barrier layer may be formed from MgO and at least any one alloy oxide of NiO, CoO, FeO as the specific oxide material, according to another approach.

Preferably, a tunneling junction magnetoresistive effect head, according to one embodiment, may be layered from a ground layer, an antiferromagnetic layer above the ground layer, a first ferromagnetic layer exchange coupled to the antiferromagnetic layer, an anti-parallel coupling layer, a second ferromagnetic layer which has a magnetic moment coupled anti-parallel to the magnetic moment of the first ferromagnetic layer through the anti-parallel coupling layer, an insulation barrier layer, and a third ferromagnetic layer between a substrate and a lower magnetic shield layer comprising a ferromagnetic body and an upper magnetic shield layer comprising a ferromagnetic body. The head may have a tunneling junction magnetoresistive effect element where a portion or all of the second ferromagnetic layer and the third ferromagnetic layer on the insulation barrier layer side is a crystal, and the insulation barrier layer may comprise MgO and a specific oxide material which has an independent cubic crystal structure and complete solid solubility with MgO.

In another embodiment, a manufacturing method for a tunneling junction magnetoresistive effect element uses sputtering in a vacuum to form a ground layer above a substrate, an antiferromagnetic layer above the ground layer, a first ferromagnetic layer above the antiferromagnetic layer, an anti-parallel coupling layer above the first ferromagnetic layer, a second ferromagnetic layer above the anti-parallel coupling layer, an insulation barrier layer above the second ferromagnetic layer, and a third ferromagnetic layer above the insulation barrier layer. After the second ferromagnetic layer is formed, the insulation barrier layer may be formed using two cathodes mounted with a MgO target as the first oxide material and the target of the specific oxide material which has an independent cubic crystal structure and complete solid solubility with MgO as the second oxide material may be discharged in a vacuum to form an oxide alloy comprising the first oxide material and the second oxide material.

In a preferred example, the insulation barrier layer may be formed by simultaneously discharging the two cathodes mounted with the target of the first oxide material and the target of the second oxide material in a vacuum, an oxide alloy comprising a mixture of the first oxide material and the second oxide material may be formed.

Preferably, in another embodiment, the insulation barrier layer may be formed by alternately discharging the two cathodes mounted with the target of the first oxide material and the target of the second oxide material in a vacuum, the first oxide material and the second oxide material being layered to form an oxide alloy.

According to another preferred embodiment, a tunneling junction magnetoresistive effect head may be formed by carrying out the manufacturing process of the tunneling junction magnetoresistive effect element between a lower magnetic shield layer comprising a ferromagnetic body that acts as the substrate and an upper magnetic shield layer comprising a ferromagnetic body.

An embodiment is described below with reference to the drawings. As predicted from W. H. Butler, X.-G. Zhang and T. C. Schulthess, "Spin Dependent Tunneling Conductance of Fe|MgO|Fe Sandwiches," *Phys. Rev R*, 63, 054416-1 (2001), by thinning the insulation barrier layer, the RA decreases, the MR ratio decreases, and the sensor sensitivity drops. In addition, if the insulation barrier layer is thinned too much, insulation breakdown of the insulation barrier layer easily occurs, and the reliability of the playback head degrades. Therefore, a method which lowers RA without thinning the film thickness of the insulation barrier layer may be used to achieve the positive effects described previously.

Figures 5, 6:
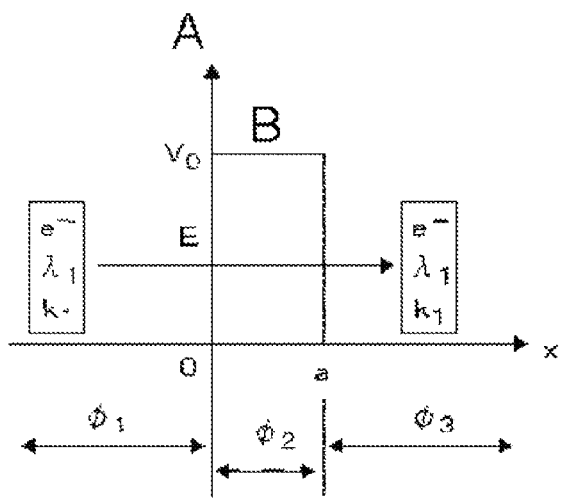
FIG. 5 shows a prediction example of the required playback track width, the stripe height, and the area resistance RA for surface recording density.
FIG. 6 shows a simplified model of the electron tunneling effect.

FIG. 6 shows a simplified model of the electron tunneling effect. The thickness of the insulation barrier layer is set to $\alpha$ and the barrier height of the insulation barrier layer to $V_0$, and an electron having the energy $E_F$ passes from the left to the right. The wavelength of an electron is $\lambda_1$, and the wave number is $k_1$. The wave function of an incident electron ($X \leq 0$) is $\phi_1$, the wave function of a transmitted electron ($a \leq X$) is $\phi_3$, and the wave function in the insulation barrier layer ($0 \leq X \leq a$) is $\phi_2$. $A_1$ is the amplitude of the traveling wave of $\phi_1$, and $A_2$ is the amplitude of the reflected wave reflected by the barrier layer of the incident electrons. $C_1$ is the amplitude of the traveling wave of a transmitted electron. $B_1$ and $B_2$ are the amplitudes of the waves of electrons in the insulation barrier layer. If the transmission probability T of an electron passing through the barrier layer is represented, then $T = C_1/A_1$.

Figure 7:
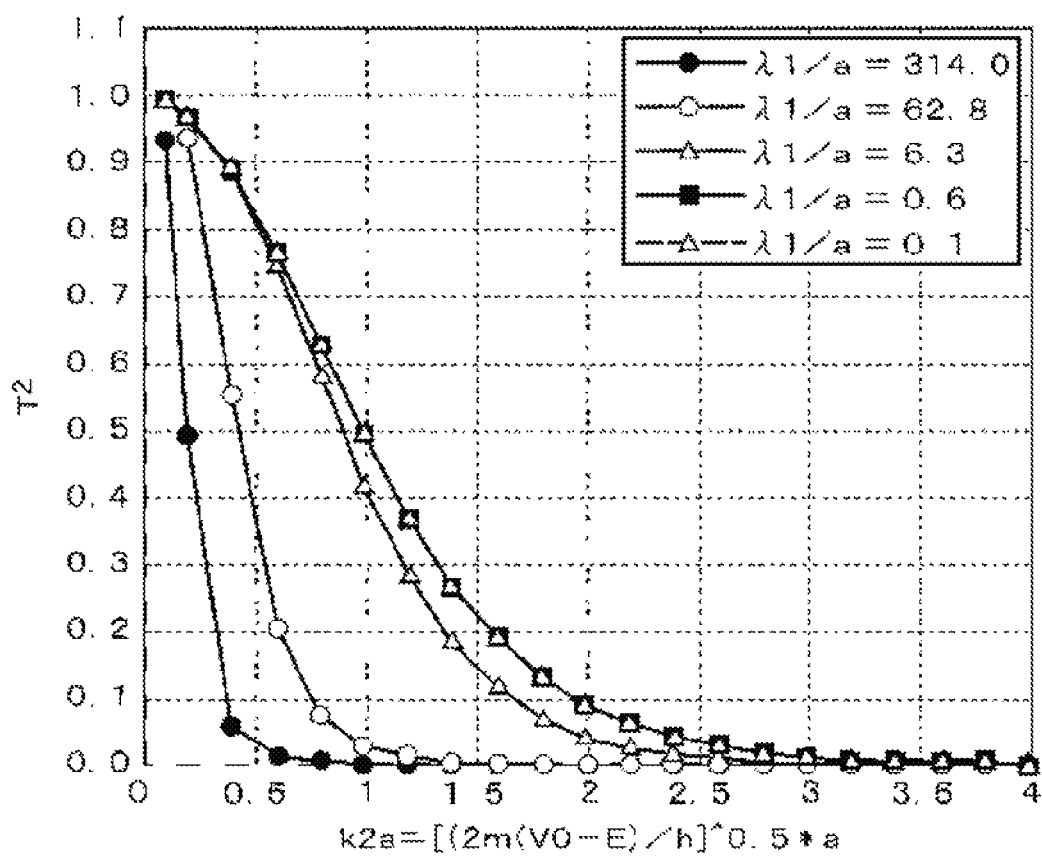
FIG. 7 shows the relationship of the barrier layer thickness and the barrier height in the probability of an electron passing through the insulation barrier layer, according to one embodiment.

Based on the model in FIG. 6, the transmission probability T of electrons was calculated. FIG. 7 shows the dependence of the transmission probability on the barrier height. The square of the transmission probability T is plotted with respect to the product of the square root of the difference between the barrier energy height $V_0$ and the electron energy E times the barrier layer thickness a. As is clear from the graph, as the height $V_0$ of the barrier layer increases, the electron transmission probability decreases abruptly. As the thickness of the barrier layer increases, the transmission probability decreases abruptly. As the wavelength of an electron increases, the transmission probability decreases.

The decrease in the transmission probability T means that the area resistance RA increases. Preferably, the difference ($V_0 - E_F$) between the barrier energy height of the insulation barrier layer and the electron energy decreases in order to reduce RA without decreasing the film thickness a of the insulation barrier layer. In FIG. 7, the calculations were conducted by varying the electron wavelength, but generally the wavelength of the transmitted electron is unique to the material because the wavelength is determined by the energy unique to the material called the Fermi energy $E_F$ and the effective mass of the electron. The elements which carry the ferromagnetism of ferromagnetic materials are limited to Fe, Co, and Ni. Because it is not easy to intentionally change the wavelength of a transmitted electron, the RA is difficult to decrease by controlling the wavelength of the electron. Therefore, a decrease in the RA may be achieved by adopting a new material in the insulation barrier layer having a lower height $V_0$ of the barrier layer in the insulation barrier layer.

Figure 8:
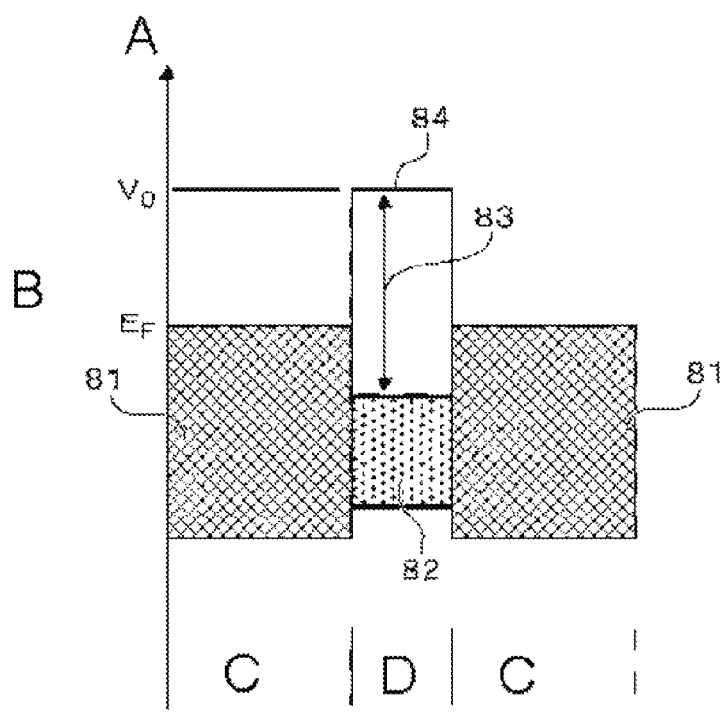
FIG. 8 is a schematic view of the electron energy state of the sandwich structure of metal/insulator/metal, according to one embodiment.

FIG. 8 shows a schematic view of the energy state of electrons in the sandwich structure of metal/insulation layer/metal, according to one embodiment. The vertical axis represents the electron energy. The part indicated by reference number 81 is the energy band occupied by metal electrons. The part indicated by reference number 82 is the valence electron band occupied by valence electrons of the insulation layer. A band gap (forbidden zone) 83 is above the valence band 82 of the insulation layer, and a conduction band 84 is above the band gap. Electrons in the conduction band contribute to general electrical conduction, excluding the tunneling phenomenon. In the insulation layer, the electrons are tightly packed in the valence electron band. The electrons in the valence band do not contribute to conduction. The energy levels do not exist in the band gap (forbidden zone), and electrons do not exist in the band gap. Since the band gap is large in the insulation layer, the electrons in the valence electron band are not excited until the conduction band, and the conduction band is empty. Because the conduction band is empty, generally, the insulation layer is not normal electrical conduction (the tunneling phenomenon is a different phenomenon than electrical conduction).

As shown in FIG. 8, the lowest energy of the conduction band becomes the barrier energy height $V_0$. This is identical to $V_0$ in FIG. 6. The electron energy contributing to conduction in a metal is the Fermi energy $E_F$ in the top surface of electrons occupying the energy band 81 of the metal. In FIG. 6, $E = E_F$. From the above, an insulation material having a small band gap 83 could be selected for the insulation layer because the height of the energy barrier is low in the TMR element having a sandwich structure of metal/insulation layer/metal.

Figure 9:
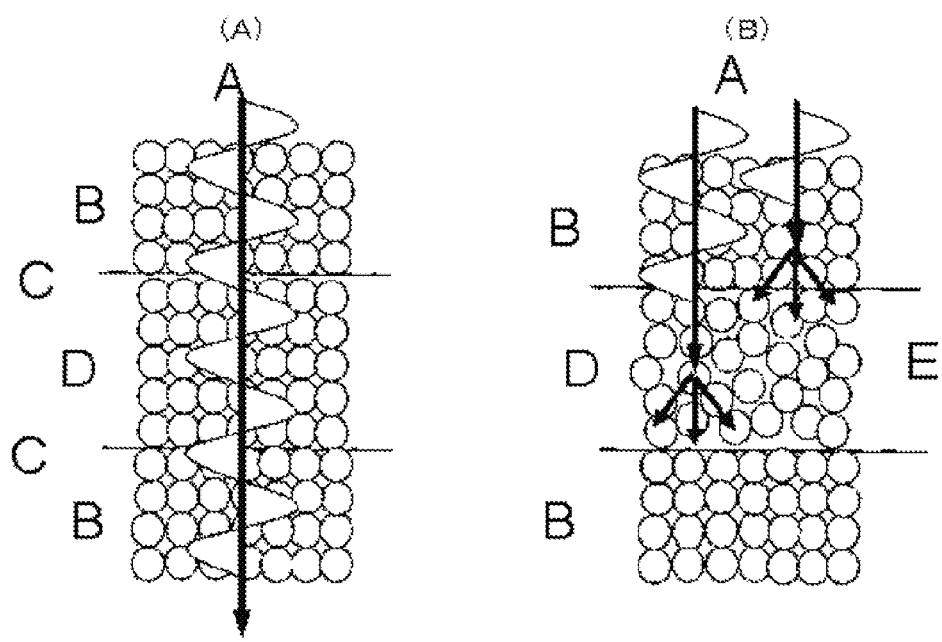
FIG. 9 is a schematic view showing a structure where the insulation barrier layer is composed of a crystal having a regular arrangement, and a structure where the insulation barrier layer is composed of an irregular crystal, according to various embodiments.

To achieve a very small RA and a high MR ratio in a TMR sensor, the insulation barrier layer should be a regularly arranged crystal. This is explained below. In FIG. 9, a situation where the insulation barrier layer is a regularly arranged crystal, and a situation where the insulation barrier layer is not a regular crystal are illustrated schematically. FIG. 9(A)

shows a preferred situation where the ferromagnetic layer and the barrier layer are both crystals. The lattice regularity at the interface is good, and the regular arrangement of atoms does not differ in the ferromagnetic layer and the barrier layer. FIG. 9(b) shows a situation where the barrier layer has an irregular arrangement.

A situation is considered where the electrons coming from the ferromagnetic layer on the top of FIG. 9 pass through a thin insulation barrier layer to reach the ferromagnetic layer on the bottom. In FIG. 9(B), because the atomic arrangement in the insulation barrier layer is not periodic, the electrons cannot pass through without scattering. The electrons are scattered when the barrier layer is reached. When the electrons scatter, the TMR effect produced by the conservation of angular momentum of the electron spin decreases because the angular momentum of the electron spin is not conserved.

On the other hand, in FIG. 9(A), both the ferromagnetic layer and the insulation barrier layer have regular atomic arrangements, and the mismatch of the atomic arrangements at the interface between the ferromagnetic layer and the insulation barrier layer is small. In this case, the scattering of electrons is difficult to produce when the electrons pass through the barrier layer. Consequently, the TMR effect produced by the conservation of electron spin becomes larger. Namely, in order to obtain a large MR change rate, regular atomic arrangements of the ferromagnetic layer and the insulation barrier layer and a small mismatch of the atomic arrangements at the interface between the two layers are desired.

Therefore, to solve problems described herein, in one example, an oxide mixture of MgO and a specific oxide material having a small band gap may be used as the material of the insulation barrier layer. The specific oxide material may have the same cubic crystal structure (e.g., an NaCl type) as MgO, a small lattice mismatch with MgO, and may have complete solid solubility with MgO. Preferred examples of the specific oxide material are described later. In another example, the insulation barrier layer of the oxide material may be formed from layers of MgO and a specific oxide material having a small band gap and not an oxide mixture of MgO and a specific oxide material having a small band gap as described above. Similar effects can be obtained by this structure.

FIG. 10 shows the band gap value, the crystal structure, the lattice mismatch with the MgO crystal, and the solid solubility limit with MgO of various oxides. Oxides having a small band gap compared to MgO, the same crystal structure as MgO, small lattice mismatch, and complete solid solubility with MgO are NiO, CoO, and FeO.

For example, materials of cobalt oxide CoO or nickel oxide NiO have the NaCl crystal structure which is identical to MgO. Also, the lattice constant mismatch is small at 0.8% and 1.2%, and there is complete solid solubility with MgO. Consequently, even if CoO, FeO, or NiO is mixed (or layered) with MgO to form the insulation barrier layer, the regular arrangement does not degrade. If these oxide materials are used in the insulation barrier layer to form the TMR element, the TMR effect is not degraded.

In contrast to the band gap of MgO of 7.2 eV, the band gap of CoO is 3.0 eV, and the band gap of NiO is 4 eV. Both have a small band gap compared to MgO, and have an average barrier height for the insulation barrier layer which is small even when the insulation barrier layer is formed by mixing (or layering) these oxides with MgO. Thus, the area resistance RA of the TMR element can be reduced without thinning the thickness of the barrier layer. The insulation barrier layer may be constructed from an alloy oxide containing either one or several of NiO, CoO, and FeO (namely, at least any one alloy oxide) as the alloy oxide mixed (or layered) with MgO.

Figure 2:
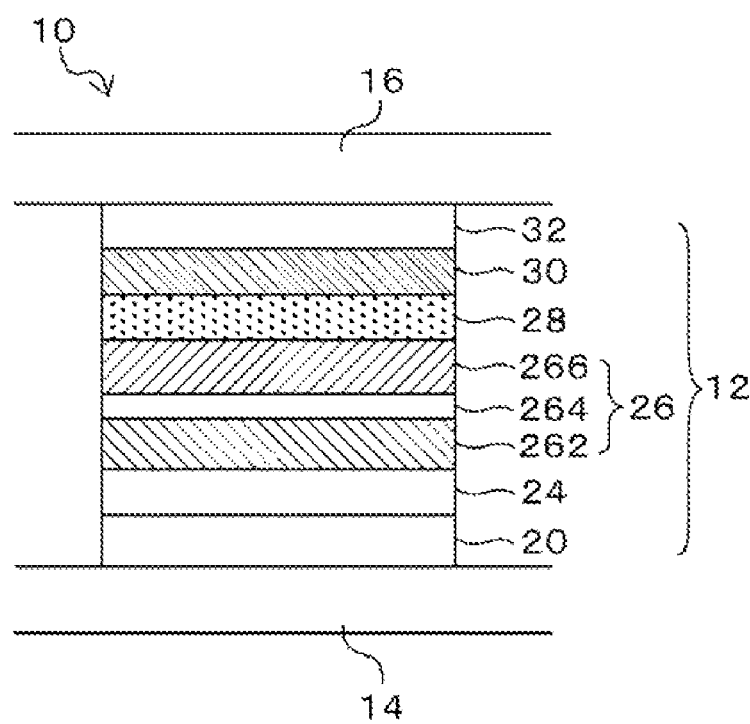
FIG. 2 shows the basic structure of a TMR head related to the working example, according to one embodiment.

Working Example 1 illustrates the structure of a tunneling junction magnetoresistive effect element. Next, the basic structure of a magnetic tunneling junction head (TMR head) related to a working example of the present invention is explained with reference to FIG. 2. FIG. 2 is a view of the TMR head seen from the air bearing surface. A TMR head 10 is constructed from a TMR film 12 arranged in layers between a lower magnetic shield layer (also acting as an electrode layer) 14 and an upper magnetic shield layer (also acting as an electrode layer) 16. The TMR film 12 is constructed from a ground layer 20, an antiferromagnetic layer 24, a first ferromagnetic layer 262 exchange coupled to the antiferromagnetic layer 24, a second ferromagnetic layer 266 which has a magnetic moment coupled anti-parallel to the magnetic moment of the first ferromagnetic layer 262 through an anti-parallel coupling layer 264, an insulation barrier layer 28, a third ferromagnetic layer 30, and a cap layer 32 deposited in layers on a lower magnetic shield layer (also acting as an electrode layer) 14 which becomes the substrate.

The first ferromagnetic layer 262 and the second ferromagnetic layer 266 may be referred to as the pinned layer. The magnetic moments of the first ferromagnetic layer 262 and the second ferromagnetic layer 266 of the pinned layer 26 have strong anti-parallel coupling. The direction of the magnetic moment of the pinned layer 26 does not easily change because the first ferromagnetic layer 262 has a strongly pinned magnetic moment because of the exchange-coupling with the antiferromagnetic layer 24. In addition, the third ferromagnetic layer 30 may be referred to as the free layer, and the direction of the magnetic moment is easily changed by a magnetic field applied externally.

Working Example 2 illustrates a manufacturing method of the tunneling junction magnetoresistive effect element. A device for forming a film by a sputtering method in a vacuum is used to deposit the layered film shown below on a substrate. The device has a mechanism for cooling the substrate and has a function for forming at least one metal material and one insulation material on the substrate by the sputtering method while the substrate is cooling. A ground layer of 2-nm Ta/2-nm Ru is formed on the substrate, an antiferromagnetic layer comprising a 6-nm Mn-20 at. % Ir alloy film on the ground layer, a first ferromagnetic layer comprising a 2-nm Co-25 at. % Fe alloy film on the antiferromagnetic layer, a 0.4-nm anti-parallel coupling layer composed of Ru on the first ferromagnetic layer, a second ferromagnetic layer comprising a 2-nm Co-40 at. % Fe-20 at. % B alloy film on the Ru anti-parallel coupling layer, and a 0.6- to 1.2-nm insulation barrier layer on the Co—Fe—B film. The insulation barrier layer may be formed after an approximately 0.5-nm CoFe alloy film not containing B is formed on the Co—Fe—B film as the second ferromagnetic layer. After the insulation barrier layer is formed, a 2.5-nm Co-8 at. % Fe-20 at. % B alloy layer is formed as the third ferromagnetic layer. An approximately 0.5-nm CoFe film not containing B may be formed on the insulation layer as the third ferromagnetic layer, and a Co—Fe—B alloy film may be formed on top. A 3-nm Ru layer is formed as the cap layer on the third ferromagnetic layer.

Here, the insulation barrier layer is formed by the following process, according to one embodiment. Specifically, a magnesium oxide MgO target and a cobalt oxide CoO target are loaded in the sputter chamber which has at least two RF cathodes in the same vacuum chamber. The sputter chamber is referred to as the insulation barrier layer sputter chamber. The substrate deposited as film up to the second ferromagnetic layer described above is set up in the insulation barrier layer sputter chamber in a vacuum. Then, argon gas is introduced, and two cathodes mounted with the MgO target and the cobalt oxide CoO target are discharged simultaneously to simultaneously deposit MgO and CoO on the substrate and form the MgO and CoO alloys, in one approach.

The MgO—CoO alloy concentration can be varied by adjusting the power applied to the cathodes mounted with MgO and CoO. The NaCl crystal structure may be obtained at all concentrations independent of the CoO concentration. The band gap decreases from the 7.2 eV of MgO until the CoO band gap value of 3.0 eV along with the CoO concentration. In addition to CoO, NiO is another effective material to mix with MgO.

Figure 3:
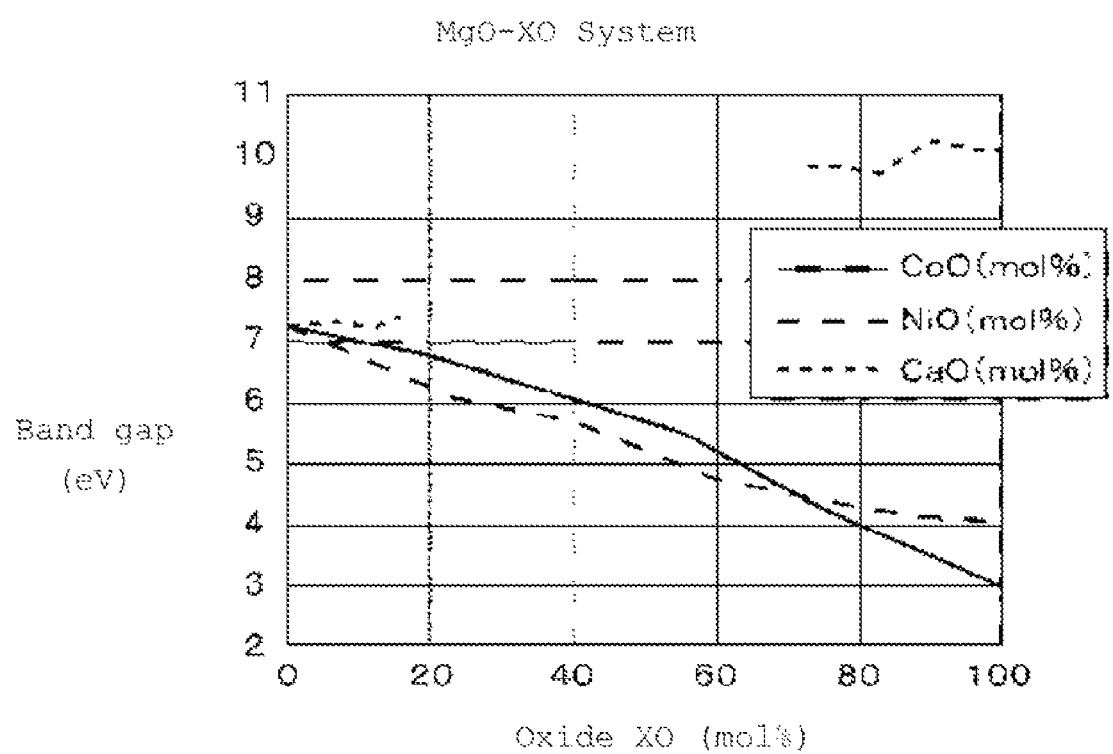
FIG. 3 shows the composition dependence of the band gap on the alloy oxide of MgO and another oxide.
Figure 4:
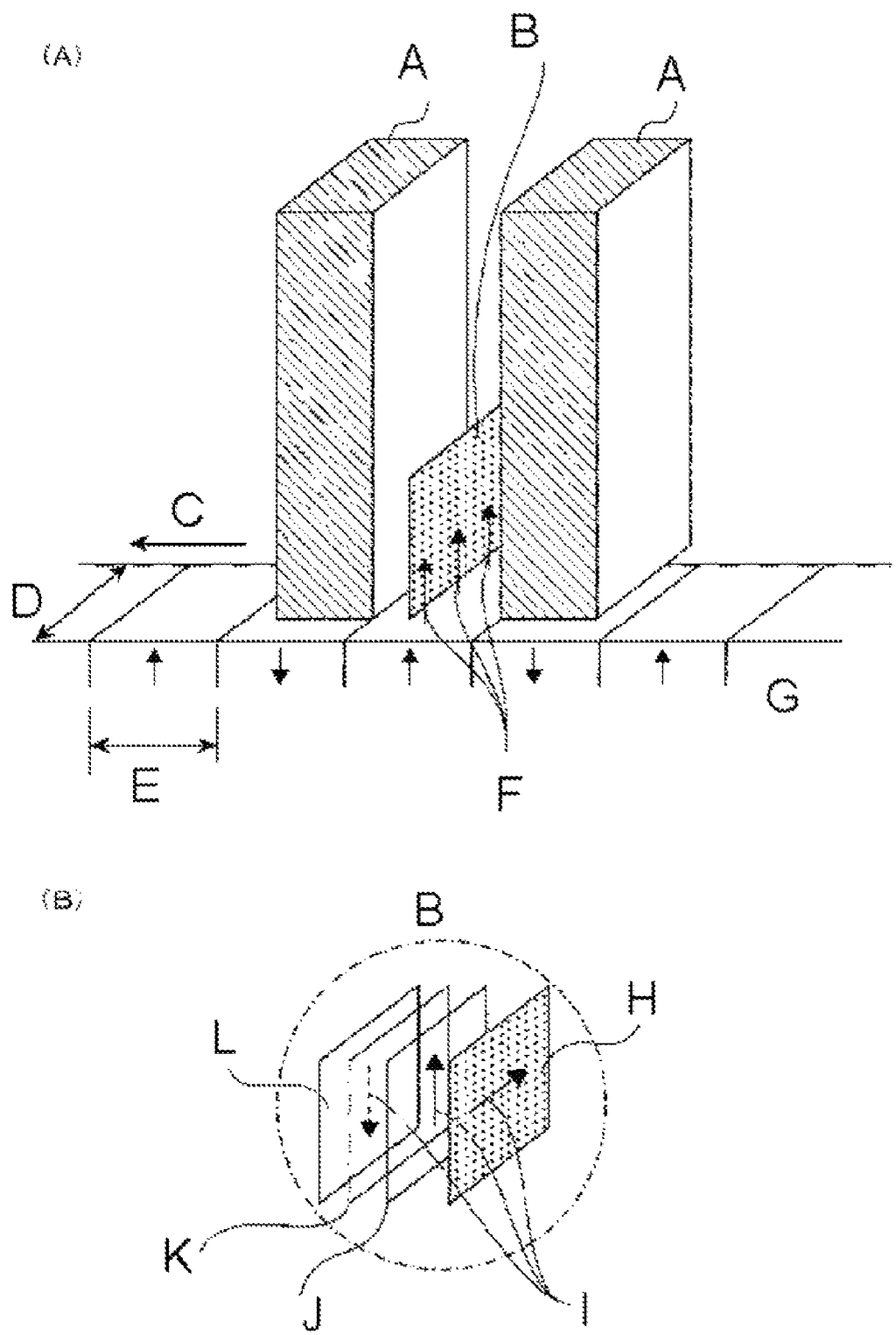
FIG. 4 shows the playback process of a playback head, according to one embodiment.

FIG. 3 shows the composition dependence of the band gap on the alloy oxide of MgO and another oxide. The band gap values of the oxide mixture of MgO and CoO, the oxide mixture of MgO and NiO, and the oxide mixture of MgO and CaO are plotted with respect to the concentrations of CoO, NiO, and CaO. For CaO, the band gap increases with an increase in concentration. When CoO and NiO are doped, the band gap decreases with an increase in concentration. CoO and NiO are known to be effective in lowering the height of the insulation barrier layer.

FIG. 1 shows the MR performance of the TMR sensor film according to a working example. Specifically, the relationship between RA and MR is shown when MgO—CoO is used in the insulation barrier layer and the film thickness of the insulation barrier layer is changed to form the TMR element. After a thermal process is applied to the sample in a strong magnetic field, an evaluation was conducted. When the CoO concentration is zero, the MR ratio decreases abruptly from the RA of 0.8 $\Omega\mu m^2$, and the MR nearly disappears at RA=0.4 $\Omega\mu m^2$. In contrast, when CoO is 25% or 50%, the abrupt MR phenomenon with the decrease in RA is no longer seen, and the MR ratio decreases gradually. As a result, in a region where RA is no more than 0.5 $\Omega\mu m^2$, a noticeable improvement in the MR ratio is seen. For example, when CoO is 25 mol %, an MR ratio of at least 40% can be obtained even when RA=0.2 $\Omega\mu m^2$, and an obvious improvement in the TMR performance is obtained.

Figure 11:
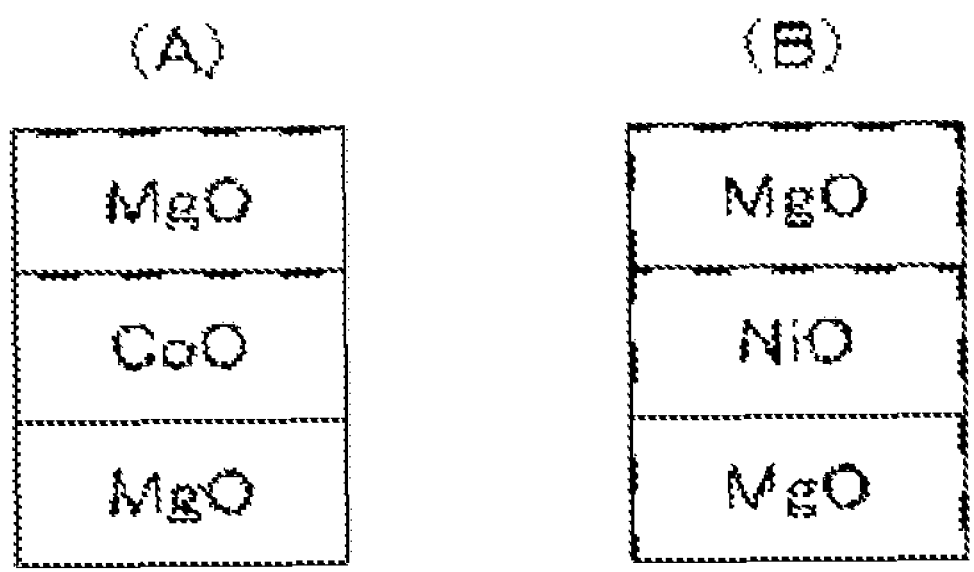
FIG. 11 shows a structural example of an insulation barrier layer according to another working example, according to one embodiment.

Working Example 3 shows that the example seen in FIG. 11 is an insulation barrier layer having a layered structure, according to one embodiment. The layered structure of the sensor film except for the insulation barrier layer is identical to that in Working Example 1. FIG. 11(A) shows an example where the insulation barrier layer is formed as a structure which sandwiches CoO between single monolayers of MgO. Similarly, FIG. 11(B) shows an example where the insulation barrier layer is formed as a structure which sandwiches NiO between single monolayers of MgO. The CoO and NiO films were changed to be two or more monolayers. Based on these examples of the structures, a higher MR ratio is obtained by forming the insulation barrier layer by a single MgO in a region having a small RA.

A method for forming an insulation barrier layer having a sandwich structure from these oxide materials is as follows. For example, an insulation barrier layer of MgO—CoO—MgO is formed as shown in FIG. 11(A). In other words, the manufacturing method of Working Example 2 described above is used, and a MgO target and a CoO target are mounted in the sputter chamber for forming the insulation barrier layer which has two RF cathodes in the same vacuum chamber, in one approach. A substrate formed as film up to the second ferromagnetic layer is set up in the insulation barrier layer sputter chamber in a vacuum. Argon gas is introduced, and, first, the cathode mounted with the MgO target is discharged temporarily. Then the cathode mounted with the CoO target is discharged temporarily. Then, the cathode mounted with the MgO target is discharged temporarily again. The insulation barrier layer is formed by the sequential deposition of MgO—CoO—MgO by the discharge process.

According to the present invention, by using an insulation barrier layer formed by mixing or layering MgO and CoO, FeO, or NiO, the TMR element can suppress the degradation of the MR change in a low area resistance region of 1.0 $\Omega\mu m^2$ or less. Thus, the playback head used in an ultra-high density hard disk drive can be realized.

In one embodiment, any of the embodiments described herein may be used in a magnetic data storage system. The magnetic data storage system may include a perpendicular magnetic recording medium, at least one tunneling junction magnetoresistive effect head having an element as described herein for reading from/writing to the perpendicular magnetic recording medium, a drive mechanism for passing the perpendicular magnetic recording medium over the at least one head, and a controller electrically coupled to the at least one head.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A tunneling junction magnetoresistive effect element, comprising:
    a ground layer;
    an antiferromagnetic layer above the ground layer;
    a first ferromagnetic layer above the antiferromagnetic layer and exchange-coupled to the antiferromagnetic layer;
    an anti-parallel coupling layer above the first ferromagnetic layer;
    a second ferromagnetic layer having a magnetic moment coupled anti-parallel to the magnetic moment of the first ferromagnetic layer via the anti-parallel coupling layer;
    an insulation barrier layer above the second ferromagnetic layer; and
    a third ferromagnetic layer above the insulation barrier layer,
    wherein at least a portion of the second ferromagnetic layer and at least a portion of the third ferromagnetic layer on an insulation barrier layer side thereof are comprised of a crystal, and
    wherein the insulation barrier layer comprises MgO and an oxide material having an independent cubic crystal structure and complete solid solubility with MgO.

2. The tunneling junction magnetoresistive effect element as recited in claim 1, wherein the oxide material comprises at least one alloy oxide of: NiO, CoO, and FeO.

3. The tunneling junction magnetoresistive effect element as recited in claim 1, wherein the insulation barrier layer comprises an oxide mixture of MgO and the oxide material.

4. The tunneling junction magnetoresistive effect element as recited in claim 3, wherein the oxide material comprises at least one alloy oxide of: NiO, CoO, and FeO.

5. The tunneling junction magnetoresistive effect element as recited in claim 1, wherein the insulation barrier layer comprises multiple layers of MgO and the oxide material.

6. The tunneling junction magnetoresistive effect element as recited in claim 5, wherein the oxide material comprises at least one alloy oxide of: NiO, CoO, and FeO.

7. A tunneling junction magnetoresistive effect head, comprising:
at least one tunneling junction magnetoresistive effect element, each tunneling junction magnetoresistive effect element comprising:
a ground layer;
an antiferromagnetic layer above the ground layer;
a first ferromagnetic layer above the antiferromagnetic layer and exchange-coupled to the antiferromagnetic layer;
an anti-parallel coupling layer above the first ferromagnetic layer;
a second ferromagnetic layer having a magnetic moment coupled anti-parallel to the magnetic moment of the first ferromagnetic layer via the anti-parallel coupling layer;
an insulation barrier layer above the second ferromagnetic layer; and
a third ferromagnetic layer above the insulation barrier layer,
wherein at least a portion of the second ferromagnetic layer and at least a portion of the third ferromagnetic layer on an insulation barrier layer side are comprised of a crystal, and
wherein the insulation barrier layer comprises MgO and an oxide material having an independent cubic crystal structure and complete solid solubility with MgO.

8. A magnetic data storage system, comprising:
a perpendicular magnetic recording medium;
at least one head having a tunneling junction magnetoresistive effect element as recited in claim 7 for reading from the perpendicular magnetic recording medium;
a drive mechanism for passing the perpendicular magnetic recording medium over the at least one head; and
a controller electrically coupled to the at least one head.

9. A method for manufacturing a tunneling junction magnetoresistive effect element, the method comprising:
forming a ground layer above a substrate;
forming an antiferromagnetic layer above the ground layer;
forming a first ferromagnetic layer above the antiferromagnetic layer;
forming an anti-parallel coupling layer above the first ferromagnetic layer;
forming a second ferromagnetic layer above the anti-parallel coupling layer;
forming an insulation barrier layer above the second ferromagnetic layer after the second ferromagnetic layer,
wherein the insulation barrier layer comprises an oxide alloy comprising a first oxide material and a second oxide material,
wherein the oxide alloy is formed via discharging two cathodes mounted with an MgO target as the first oxide material and a target of the second oxide material which has an independent cubic crystal structure and complete solid solubility with MgO in a vacuum; and
forming a third ferromagnetic layer above the insulation barrier layer.

10. The method as recited in claim 9, further comprising:
forming a lower magnetic shield layer as the substrate below the ground layer, the lower magnetic shield comprising a ferromagnetic body; and
forming an upper magnetic shield layer above the insulation barrier layer, the upper magnetic shield comprising a ferromagnetic body.

11. The method as recited in claim 9, wherein forming the insulation barrier layer comprises forming an oxide alloy comprising a mixture of the first oxide material and the second oxide material via simultaneously discharging two cathodes mounted with the target of the first oxide material and the target of the second oxide material in a vacuum.

12. The method as recited in claim 11, further comprising:
forming a lower magnetic shield layer below the ground layer, the lower magnetic shield comprising a ferromagnetic body and acting as the substrate; and
forming an upper magnetic shield layer above the insulation barrier layer, the lower magnetic shield comprising a ferromagnetic body.

13. The method as recited in claim 9, wherein forming the insulation barrier layer comprises depositing the first oxide material and the second oxide material to form an oxide alloy via alternately discharging the two cathodes mounted with the target of the first oxide material and the target of the second oxide material in a vacuum.

14. The method as recited in claim 13, further comprising:
forming a lower magnetic shield layer below the ground layer, the lower magnetic shield comprising a ferromagnetic body and acting as the substrate; and
forming an upper magnetic shield layer above the insulation barrier layer, the lower magnetic shield comprising a ferromagnetic body.

15. The method as recited in claim 9, wherein the ground layer, the antiferromagnetic layer, the first ferromagnetic layer, the anti-parallel coupling layer, the second ferromagnetic layer, and the insulation barrier layer are formed via sputtering in a vacuum.

* * * * *

UNITED STATES PATENT AND TRADEMARK OFFICE
CERTIFICATE OF CORRECTION

PATENT NO.         : 8,284,526 B2
APPLICATION NO.    : 12/955746
DATED              : October 9, 2012
INVENTOR(S)        : Koichi Nishioka et al.

It is certified that error appears in the above-identified patent and that said Letters Patent is hereby corrected as shown below:

In the specification:

col. 2, line 67, replace "8," with --B,--;

col. 3, lines 44-45, replace "anti ferromagnetic" with --antiferromagnetic--;

col. 7, line 43, replace "R," with --B,--.

Signed and Sealed this
Eighth Day of January, 2013

David J. Kappos
*Director of the United States Patent and Trademark Office*